(12) United States Patent
Miyamoto (10) Patent No.: US 9,245,612 B2
(45) Date of Patent: Jan. 26, 2016

(54) SEMICONDUCTOR DEVICE HAVING BIT LINES HIERARCHICALLY STRUCTURED

(71) Applicant: PS4 Luxco S.a.r.l., Luxembourg (LU)

(72) Inventor: Takayuki Miyamoto, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 134 days.

(21) Appl. No.: 13/748,433

(22) Filed: Jan. 23, 2013

(65) Prior Publication Data

US 2013/0194857 A1   Aug. 1, 2013

(30) Foreign Application Priority Data

Jan. 27, 2012   (JP) ................................. 2012-014712

(51) Int. Cl.

| | |
|---|---|
| G11C 8/00 | (2006.01) |
| G11C 11/4063 | (2006.01) |
| G11C 11/4076 | (2006.01) |
| G11C 11/408 | (2006.01) |
| G11C 11/4091 | (2006.01) |
| G11C 11/4097 | (2006.01) |

(52) U.S. Cl.
CPC ........ *G11C 11/4063* (2013.01); *G11C 11/4076* (2013.01); *G11C 11/4085* (2013.01); *G11C 11/4091* (2013.01); *G11C 11/4097* (2013.01); *G11C 2207/005* (2013.01)

(58) Field of Classification Search
USPC ............. 365/149, 194, 222, 203, 205, 230.03
See application file for complete search history.

(56) References Cited

U.S. PATENT DOCUMENTS

| | | | |
|---|---|---|---|
| 5,682,343 A * | 10/1997 | Tomishima et al. | ............ 365/63 |
| 8,072,828 B2 | 12/2011 | Kajigaya | |
| 8,102,695 B2 | 1/2012 | Ono et al. | |
| 2007/0242539 A1* | 10/2007 | Ilda | ............... 365/203 |
| 2009/0273961 A1 | 11/2009 | Ono et al. | |
| 2011/0026292 A1* | 2/2011 | Narui | ............... 365/63 |
| 2011/0026348 A1* | 2/2011 | Narui | .......... 365/210.1 |
| 2011/0149663 A1* | 6/2011 | Yoshida | ........ 365/194 |
| 2011/0205820 A1* | 8/2011 | Takayama et al. | ............ 365/200 |
| 2012/0092921 A1 | 4/2012 | Ono et al. | |
| 2012/0113736 A1* | 5/2012 | Kajigaya | ........ 365/203 |
| 2012/0127816 A1* | 5/2012 | Kajigaya et al. | .............. 365/205 |
| 2012/0147686 A1* | 6/2012 | Takayama et al. | ............. 365/203 |

FOREIGN PATENT DOCUMENTS

JP   2009-271985 A   11/2009

* cited by examiner

*Primary Examiner* — Hoai V Ho
(74) *Attorney, Agent, or Firm* — Kunzler Law Group, PC (57) ABSTRACT

Disclosed herein is a device that includes: a sense amplifier circuit activated in response to a first control signal; a first global bit line coupled to the sense amplifier circuit; a first local bit line; a first transistor electrically coupled between the first global bit line and the first local bit line, the first transistor being rendered conductive in response to a second control signal; a first memory cell; a first cell transistor electrically coupled between the first local bit line and the first memory cell, the first cell transistor being rendered conductive in response to a third control signal; and a control circuit producing the first, second, and third control signals such that the second control signal is produced after producing the third control signal and the first control signal is produced after producing the second and third control signals.

10 Claims, 12 Drawing Sheets

SEMICONDUCTOR DEVICE HAVING BIT LINES HIERARCHICALLY STRUCTURED

BACKGROUND OF THE INVENTION

1. Field of the Invention

The present invention relates to a semiconductor device, and more particularly relates to a semiconductor device including bit lines that are hierarchically structured.

2. Description of Related Art

Many of semiconductor memory devices as represented by a DRAM (Dynamic Random Access Memory) have a plurality of word lines extending in a row direction and a plurality of bit lines extending in a column direction. A plurality of memory cells are arranged at intersections between the word lines and the bit lines. When one of the word lines is selected, memory cells allocated to the selected word line are electrically connected to corresponding bit lines and then data held in the memory cells are readout to the bit lines. The read data are amplified by sense amplifiers connected to the bit lines, respectively.

However, with the configuration mentioned above, one sense amplifier needs to be provided for each bit line or each pair of bit lines and thus many sense amplifiers are required. As a method to solve this problem, a semiconductor memory device using bit lines that are hierarchically structured is proposed (see Japanese Patent Application Laid-open No. 2009-271985).

The semiconductor memory device described in Japanese Patent Application Laid-open No. 2009-271985 includes local bit lines each connected to memory cells and global bit lines each connected to a sense amplifier. A plurality of local bit lines are allocated to one global bit line to reduce the number of required sense amplifiers.

However, in the semiconductor memory device described in Japanese Patent Application Laid-open No. 2009-271985, switch circuits that connect the global bit line and the local bit line are configured to be turned on simultaneously with activation of a corresponding word line. As a result, the local bit line is connected to the global bit line before data is sufficiently read out to the local bit line. Thus, for example, when the global bit line receives noise from another adjacent global bit line, data is adversely inverted. Such a problem occurs not only in semiconductor memory devices such as a DRAM but also in all semiconductor devices including bit lines that are hierarchically structured.

SUMMARY

In one embodiment, there is provided a semiconductor device that includes: first and second global bit lines; a sense amplifier configured to amplify a potential difference between the first and second global bit lines; first and second local bit lines; a first switch circuit connected between the first local bit line and the first global bit line; a second switch circuit connected between the second local bit line and the second global bit line; first and second memory cells; a first cell transistor connected between the first memory cell and the first local bit line; a second cell transistor connected between the second memory cell and the second local bit line; and a control circuit configured to bring the first and second switch circuits into an ON state after bringing one of the first and second cell transistors into an ON state in response to a predetermined command.

In another embodiment, there is provided a semiconductor device that includes: a sense amplifier circuit receiving a first control signal and activated in response to the first control signal; a first global bit line coupled to the sense amplifier circuit; a first local bit line; a first transistor including a gate that is supplied with a second control signal and a source-drain path that is electrically coupled between the first global bit line and the first local bit line, the first transistor being rendered conductive in response to the second control signal; a first memory cell; a first cell transistor including a gate that is supplied with a third control signal and a source-drain path that is electrically coupled between the first local bit line and the first memory cell, the first cell transistor being rendered conductive in response to the third control signal; and a control circuit configured to produce the first, second, and third control signals such that the second control signal is produced after producing the third control signal and the first control signal is produced after producing the second and third control signals.

According to the present invention, the local bit lines are connected to the global bit line after data are read out to some extent to the local bit lines and therefore risk of data inversion caused by the influence of noise is reduced.

DETAILED DESCRIPTION OF THE EMBODIMENTS

Preferred embodiments of the present invention will be explained below in detail with reference to the accompanying drawings. A semiconductor device including bit lines that are hierarchically structured is disclosed in a U.S. patent application Ser. No. 13/359,453, for example. The disclosures of the above patent document are incorporated by reference herein in their entirety by reference thereto. The following detailed description refers to the accompanying drawings that show, byway of illustration, specific aspects and embodiments in which the present invention may be practiced. These embodiments are described in sufficient detail to enable those skilled in the art to practice the present invention. Other embodiments may be utilized, and structure, logical and electrical changes may be made without departing from the scope of the present invention. The various embodiments disclosed herein are not necessarily mutually exclusive, as some disclosed embodiments can be combined with one or more other disclosed embodiments to form new embodiments.

Figure 1:
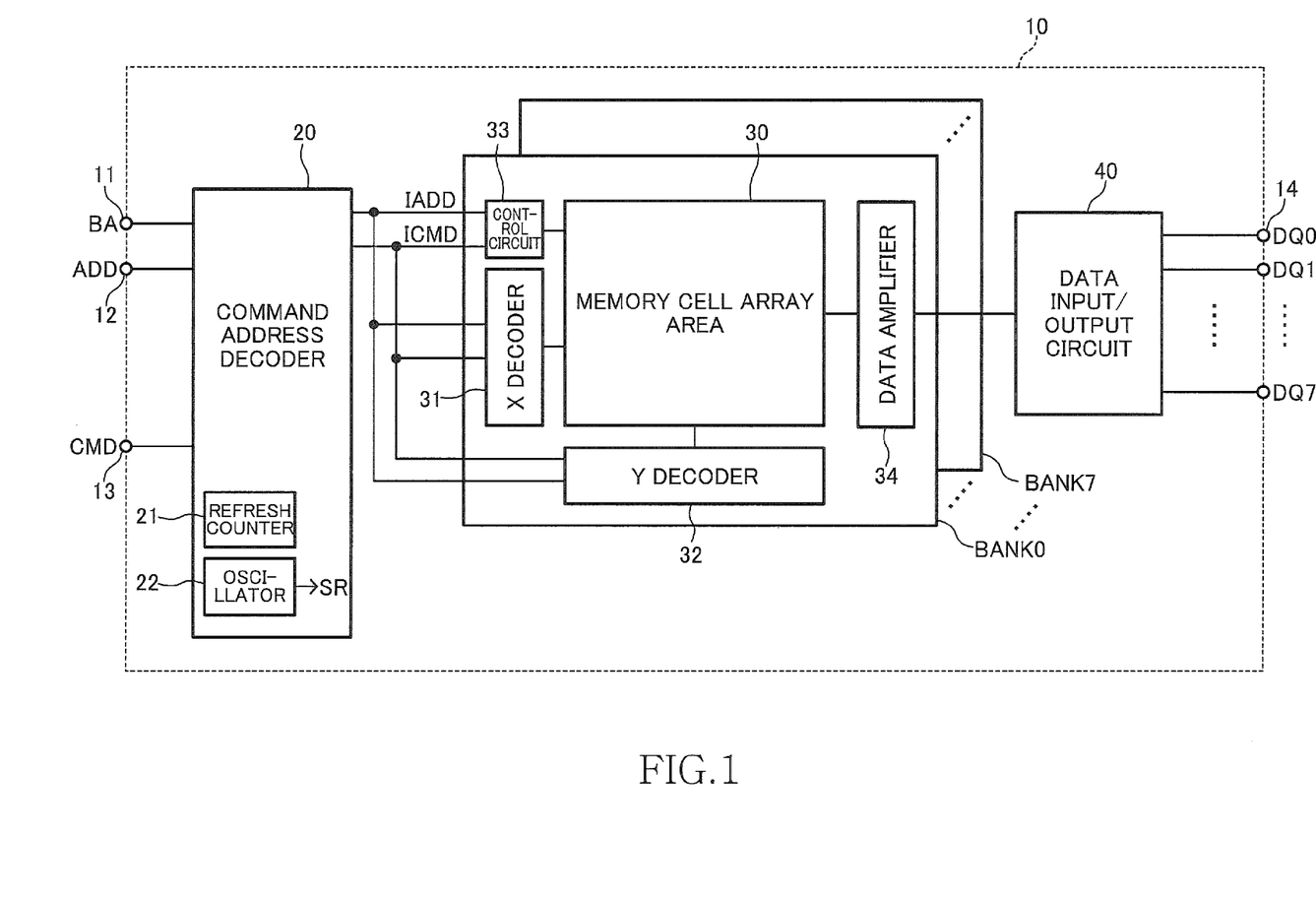
FIG. 1 is a block diagram indicative of an overall configuration of a semiconductor device according to an embodiment of the present invention.

Referring now to FIG. 1, the semiconductor device 10 according to the first embodiment of the present invention is a DRAM and is integrated on a single semiconductor chip. However, subjects to which the present invention is applicable are not limited to a DRAM, but the present invention can be applied to all semiconductor devices including bit lines that are hierarchically structured. As shown in FIG. 1, the semiconductor device 10 according to the present embodiment includes a bank address terminal 11, an address terminal 12, a command terminal 13, and a data input/output terminal 14 as external terminals. While other terminals such as a clock terminal and a power supply terminal are practically provided, these terminals are not shown in FIG. 1.

The bank address terminal 11 and the address terminal 12 are supplied with a bank address signal BA and an address signal ADD, respectively, from outside. The bank address signal BA is a signal for designating a memory bank to be accessed. Although not particularly limited thereto, the semiconductor device 10 according to the present embodiment includes eight memory banks BANK0 to BANK7 and the memory banks BANK0 to BANK7 can be accessed on a non-exclusive basis according to the bank address signal BA. Each of the memory banks BANK0 to BANK7 includes a memory cell array area 30, an X decoder 31, a Y decoder 32, a control circuit 33, and a data amplifier 34.

The address signal ADD indicates a row address or a column address in a selected memory bank. The row address is a signal for selecting a word line and the column address is a signal for selecting a bit line. The bank address signal BA and the address signal ADD are supplied to a command address decoder 20. The command address decoder 20 generates an internal address signal IADD based on the bank address signal BA and address signal ADD.

The command terminal 13 is supplied with a command signal CMD from outside. The command signal CMD is a signal for specifying an operation of the semiconductor device 10 and includes an active command, a read command, a write command, and the like. The active command is issued when a row access is performed. The address signal ADD supplied together with the active command is handled as the row address. The read command or the write command is issued when a column access is performed. The address signal ADD supplied together with the read command or the write command is handled as the column address.

The command signal CMD is supplied to the command address decoder 20. The command address decoder 20 decodes the command signal CMD to generate an internal command signal ICMD. Types of the command signal CMD include an auto-refresh command and a self-refresh command in addition to the active command, the read command, and the write command mentioned above. When the auto-refresh command is issued, a refresh operation is performed at a row address indicated by a refresh counter 21 included in the command address decoder 20. When the self-refresh command is issued, a self-refresh signal SR is periodically activated by an oscillator 22 and a refresh operation is performed in response thereto at a row address indicated by the refresh counter 21. The self-refresh signal SR constitutes a part of the internal command signal ICMD.

As shown in FIG. 1, the internal address signal IADD and the internal command signal ICMD output from the command address decoder 20 are supplied to the X decoder 31, the Y decoder 32, and the control circuit 33 included in each of the memory banks BANK0 to BANK7.

The X decoder 31 selects at least one of word lines in the corresponding memory cell array area 30 based on the row address. The Y decoder 32 selects at least one of bit lines in the memory cell array area 30 based on the column address. The bit line selected by the Y decoder 32 is connected to a data input/output circuit 40 via the data amplifier 34. The data input/output circuit 40 supplies data read out via the data amplifier 34 to the data input/output terminal 14 or supplies data input via the data input/output terminal 14 to the data amplifier 34.

Accordingly, when the row address is supplied with the active command and then the column address is supplied with the read command, data in a memory cell arranged at an intersection between a word line specified by the row address and a bit line specified by the column address is read out from the data input/output terminal 14. When the row address is supplied with the active command, then the column address is supplied with the write command, and next, data is input through the data input/output terminal 14, the data is written into a memory cell arranged at an intersection between a word line specified by the row address and a bit line specified by the column address.

The control circuit 33 controls operation timings of sub-word drivers (SWD) and local switch drivers (LSD) included in the memory cell array area 30. Details of the control circuit 33 are explained later.

Figure 2:
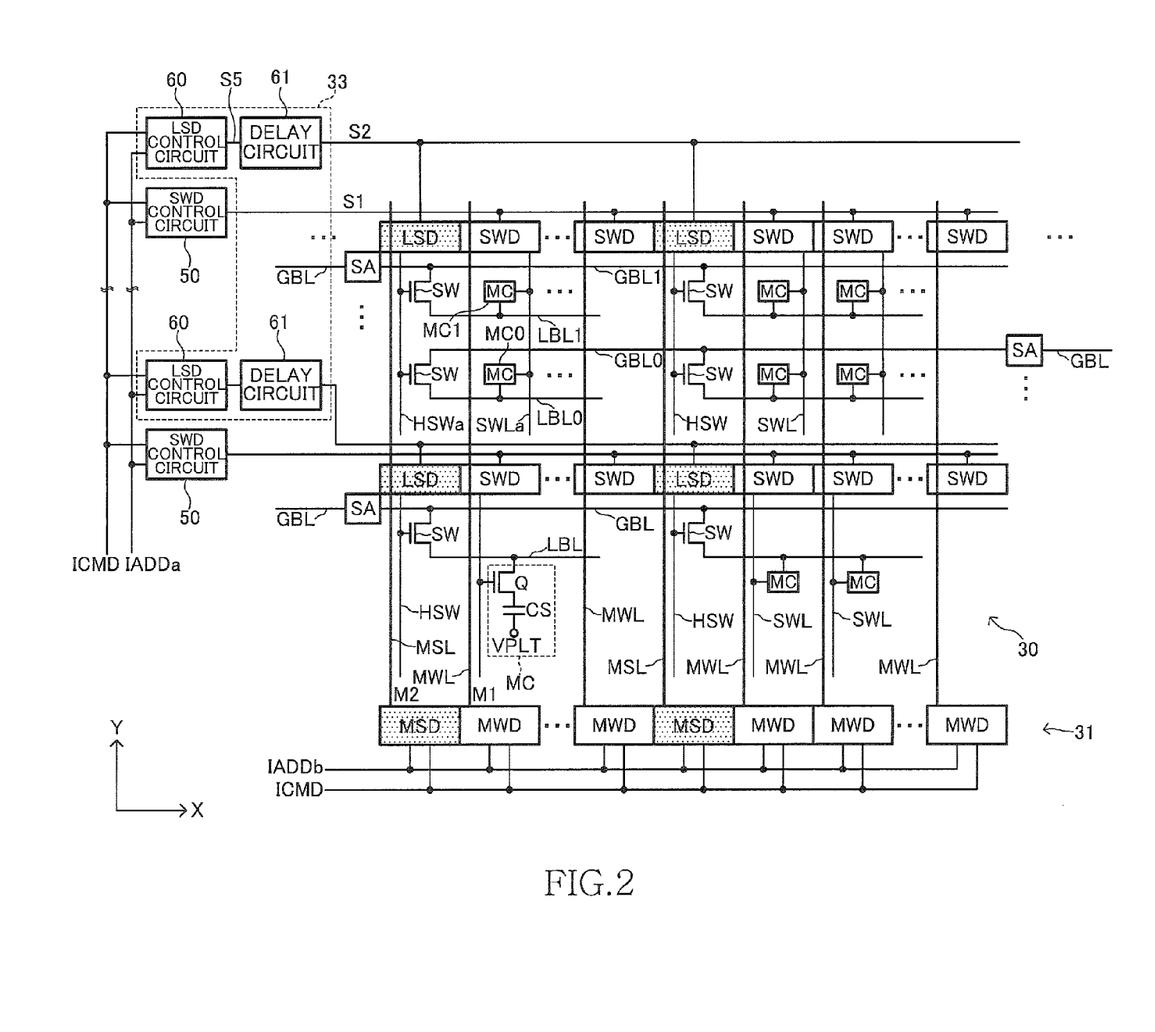
FIG. 2 is a circuit diagram for explaining the inside of the memory cell array area shown in FIG. 1 in more detail.

Turning to FIG. 2, a plurality of global bit lines GBL and a plurality of local bit lines LBL, both of which extend in an X direction, are arranged in the memory cell array area 30. The global bit lines GEL are hierarchically high-order bit lines and are connected to corresponding sense amplifiers SA, respectively. The local bit lines LBL are hierarchically low-order bit lines and are connected to memory cells MC. A switch circuit SW is connected between the global bit line GBL and the local bit line LBL.

The sense amplifier SA is a circuit that amplifies a potential difference appearing between a pair of global bit lines GBL. An operation timing of the sense amplifier SA is controlled by the control circuit 33 shown in FIG. 1. An operation of the sense amplifier SA is controlled by a sense-amplifier enable signal (SAE), which is explained later. Although not shown in FIG. 2, the sense amplifier SA includes an equalizer circuit (EQ) that equalizes potentials of the pair of global bit lines GBL. An operation of the equalizer circuit is controlled by an equalization signal (BLEQ), which is explained later. The equalization signal (BLEQ) is generated by the control circuit 33.

As shown in FIG. 2, a plurality of local bit lines LBL are allocated to each of the global bit lines GBL. This enables many memory cells MC to be allocated to one sense amplifier SA, thereby reducing the number of sense amplifiers SA. Each of the local bit lines LBL is connected to the global bit line GBL via the corresponding switch circuit SW. In the present embodiment, the switch circuit SW is constituted by an N-channel MOS transistor and a gate electrode thereof is connected to a hierarchy switch line HSW. However, inclusion of the N-channel. MOS transistor in the switch circuit SW is not essential in the present invention. Another element or a circuit constituted by a plurality of elements can be used for the switch circuit SW. In any case, a control terminal of the switch circuit SW (the gate electrode in the case of the MOS transistor) is connected to the corresponding hierarchy switch line HSW. The hierarchy switch line HSW is driven by a corresponding local switch driver LSD.

As described above, the semiconductor device 10 according to the present embodiment is a DRAM and thus each of the memory cells MC is constituted by a series circuit of a memory cell transistor Q and a memory cell capacitor CS. The memory cell transistor Q is constituted by an N-channel MOS transistor and has one end connected to the corresponding local bit line LBL and the other end connected to one end of the memory cell capacitor CS. A plate potential VPLT is supplied to the other end of the memory cell capacitor CS. A gate electrode of the memory cell transistor Q is connected to a corresponding sub-word line SWL. In the present specification, the sub-word line SWL may be also referred to simply as "word line". The sub-word line SWL is driven by a corresponding sub-word driver SWD. With this configuration, when one of the sub-word lines SWL is activated, the corresponding memory cell transistors Q are turned on, which causes the corresponding memory cell capacitors CS to be electrically connected to the local bit lines LBL. Accordingly, data stored in the memory cell capacitors CS are read out to the corresponding local bit lines LBL. In the present specification, the memory cell capacitor CS may be also referred to simply as "memory cell". Inclusion of the N-channel MOS transistor in the memory cell transistor Q is not essential in the present invention. Another element or a circuit constituted by a plurality of elements can be used therefor. In any case, a control terminal of the memory cell transistor Q (the gate electrode in the case of the MOS transistor) is connected to the corresponding sub-word line SWL.

Each of the sub-word drivers SWD drives the sub-word line SWL based on a main word signal M1 and a sub-word control signal S1. The main word signal M1 is supplied from a main word driver MWD via a main word line MWL. The sub-word control signal S1 is supplied from a sub-word control circuit 50. The sub-word control circuit 50 and the main word driver MWD are both circuit blocks included in the X decoder 31 shown in FIG. 1 and operate based on internal address signals IADDa and IADDb, which are parts of the row address, respectively. In the present specification, the sub-word control signal S1 output from the sub-word control circuit 50 may be also referred to as "third control signal".

Each of the local switch drivers LSD drives the hierarchy switch line HSW based on a main-switch control signal M2 and a local-switch control signal S2. The main-switch control signal M2 is supplied from a main switch driver MSD via a main switch line MSL. The main switch driver MSD is a circuit block included in the X decoder 31 shown in FIG. 1 and operates based on the internal address signal IADDb which is a part of the row address. The local-switch control signal S2 is obtained by delaying a local-switch control signal S5 output from a local-switch control circuit 60 with a delay circuit 61. Accordingly, while activation timings of the sub-word control signal S1 and the local-switch control signal S5 are substantially the same, an activation timing of the local-switch control signal S2 is delayed from the activation timing of the sub-word control signal S1 by a predetermined time. The local-switch control circuit 60 and the delay circuit 61 are circuit blocks included in the control circuit shown in FIG. 1. The local-switch control circuit 60 operates simultaneously with the sub-word control circuit 50 based on the internal address signal IADDa which is a part of the row address. In the present specification, the local-switch control signal S2 output from the delay circuit 61 is also referred to as "second control signal".

Figure 3:
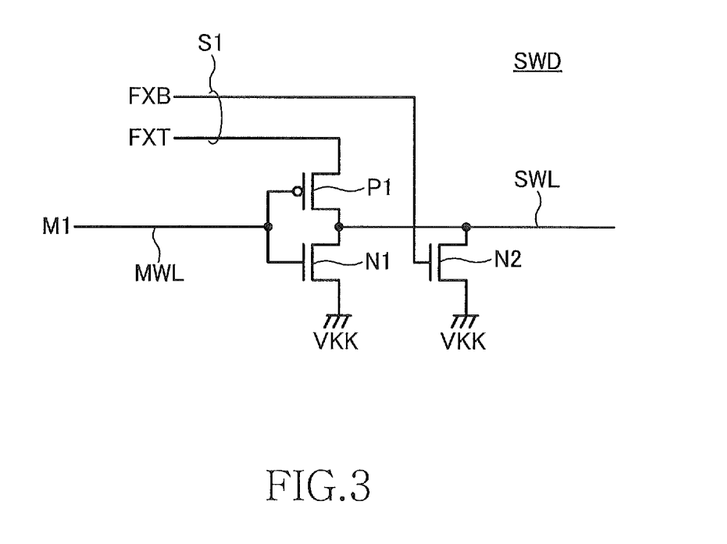
FIG. 3 is a circuit diagram indicative of a sub-word driver shown in FIG. 2.

Turning to FIG. 3, the sub-word driver SWD includes a P-channel MOS transistor P1 and N-channel MOS transistors N1 and N2 all having drains connected to the sub-word line SWL. A negative potential VKK is supplied to sources of the transistors N1 and N2. As shown in FIG. 3, the sub-word control signal S1 is composed of complementary signals FXT and FXB. The signal FXT is supplied to a source of the transistor P1 and the signal FXB is supplied to a gate electrode of the transistor N2. The main word signal M1 is supplied to gate electrodes of the transistors P1 and N1 via the main word line MWL. With this configuration, when the main word signal M1 is activated to a low level and the signals FXT and FXB are activated to high and low levels, respectively, the sub-word line SWL is driven to the level of the signal FXT (a boost potential VPP). On the other hand, when the main word signal M1 is deactivated to a high level or when the signals FXT and FXB are deactivated to low and high levels, respectively, the sub-word line SWL is reset to the negative potential VKK. In the present embodiment, the signals FXT and FXB are activated to high and low levels, respectively, after the main word signal M1 is activated to a low level, and therefore a timing of activation of the sub-word line SWL is determined by the sub-word control signal S1.

Figure 4:
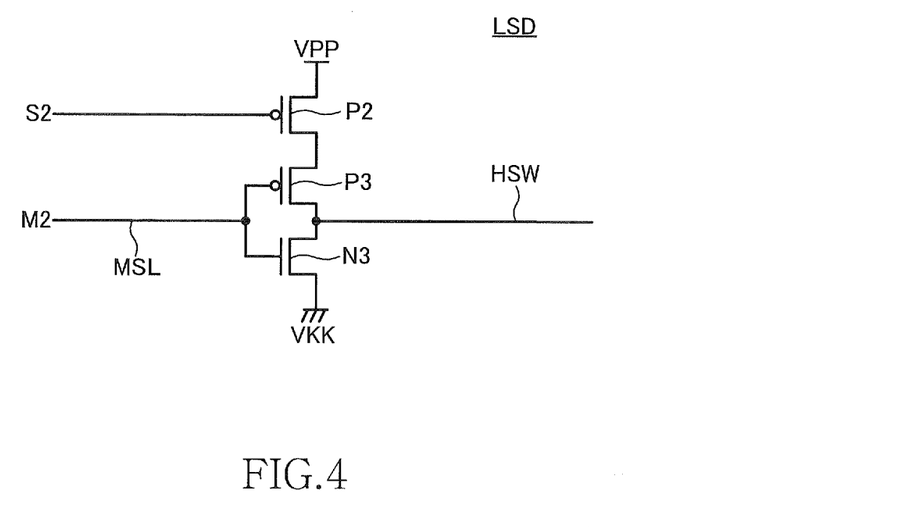
FIG. 4 is a circuit diagram indicative of a local switch driver shown in FIG. 2.

Turning to FIG. 4, the local switch driver LSD includes P-channel MOS transistors P2 and P3 and an N-channel MOS transistor N3 which are series-connected between a boost potential VPP and a negative potential VKK. The local-switch control signal S2 is supplied to a gate electrode of the transistor P2 and the main-switch control signal M2 is supplied to gate electrodes of the transistors P3 and N3 via the main switch line MSL. A common drain of the transistors P3 and N3 is connected to the hierarchy switch line HSW. With this configuration, when the main-switch control signal M2 and the local-switch control signal S2 are activated to low levels, the hierarchy switch line HSW is drive to the boost potential VPP. On the other hand, when the main-switch control signal M2 is deactivated to a high level, the hierarchy switch line HSW is reset to the negative potential VKK. In the present embodiment, the local-switch control signal S2 is activated to a low level after the main-switch control signal M2 is activated to a low level, and therefore a timing of activation of the hierarchy switch line HSW is determined by the local-switch control signal S2.

An operation of the semiconductor device 10 according to the present embodiment is explained next.

Figure 5:
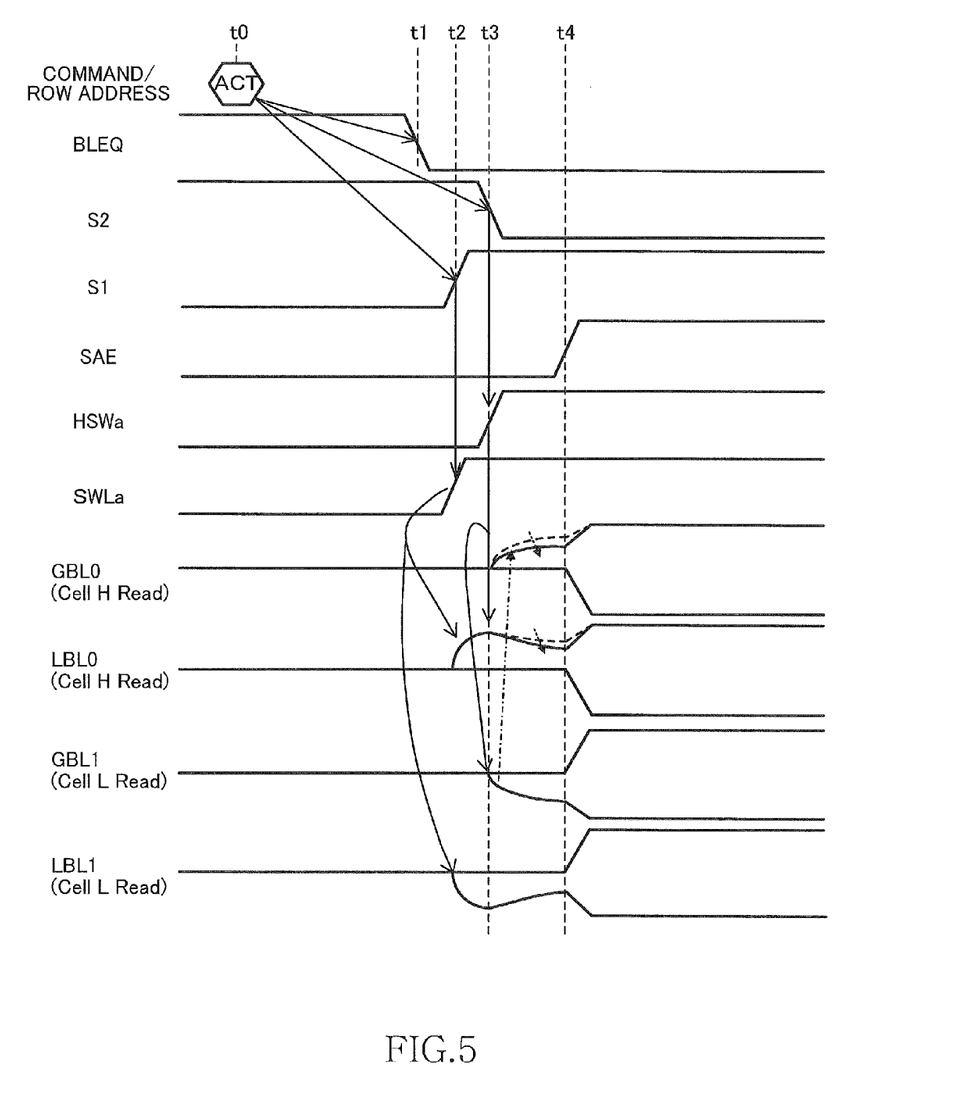
FIG. 5 is a timing chart for explaining an operation of the semiconductor device shown in FIG. 1.

The timing chart shown in FIG. 5 illustrates an operation at the time of a row access. The row access is performed when the active command or the auto-refresh command is issued from outside or when the self-refresh signal SR is activated. FIG. 5 shows an example in which the active command is issued from outside.

In a state before an active command ACT is issued (before a time t0), the sub-word line SWL and the hierarchy switch line HSW have been deactivated to a low level. Therefore, any of the memory cells MC is not connected to the corresponding local bit line LBL and any of the local bit lines LBL is not connected to the corresponding global bit line GBL. The equalization signal BLEQ has been activated to a high level and the sense-amplifier enable signal SAE has been deactivated to a low level. Accordingly, each pair of global bit lines GBL is equalized to the same potential and is in a precharged state. In the present specification, the equalization signal BLEQ may be also referred to as "third control signal" and the sense-amplifier enable signal SAE may be also referred to as "first control signal".

Figure 6A:
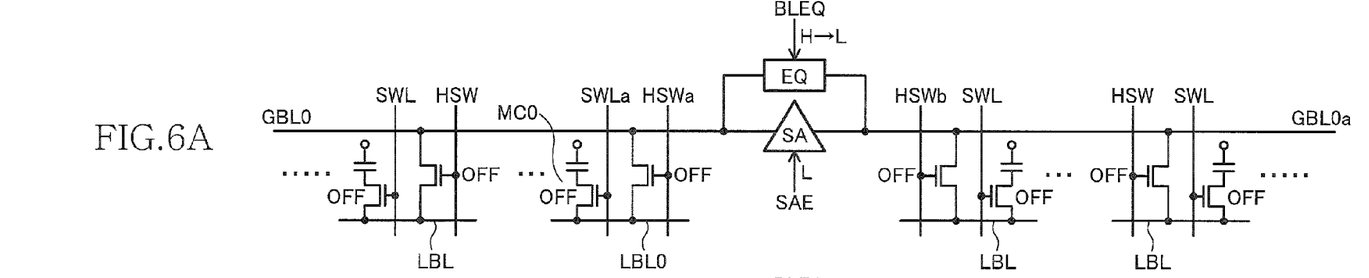
FIGS. 6A to 6C are circuit diagrams for explaining an operation at each operation timing.

When the active command ACT is issued and the address signal ADD is supplied at the time t0, the equalization signal BLEQ is deactivated to a low level at a time t1. This releases equalization of each pair of global bit lines GBL. However, because the sense-amplifier enable signal SAE is kept at the low level at this stage, the sense amplifiers SA are in a deactivated state. Therefore, the precharged states of the global bit lines GBL are maintained. An operation performed before and after the time t1 is as shown in FIG. 6A. FIG. 6A shows a state where the equalization signal BLEQ changes from a high level to a low level. A global bit line GBL0 shown in FIG. 6A is a bit line from which data is to be read out. The global bit line GBL0 forms a pair with a global bit line GBL0a. The global bit lines GBL0 and GBL0a are connected to the same sense amplifier SA.

At a time t2, the sub-word control signal S1 is activated. This changes a sub-word line SWL specified by the row address to a high level. In the example shown in FIG. 5, a sub-word line SWLa is selected based on the address signal ADD supplied at the time t0. As shown in FIG. 2, memory cells MC selected by the sub-word line SWLa are electrically coupled to local bit lines LBL0 and LBL1, respectively. When the sub-word line SWLa is activated, the memory cell transistors Q included in the corresponding memory cells MC0 and MC1 are turned on, and accordingly data stored in the memory cell capacitors CS are read out to the local bit lines LBL0 and LBL1, respectively.

Figure 6B:
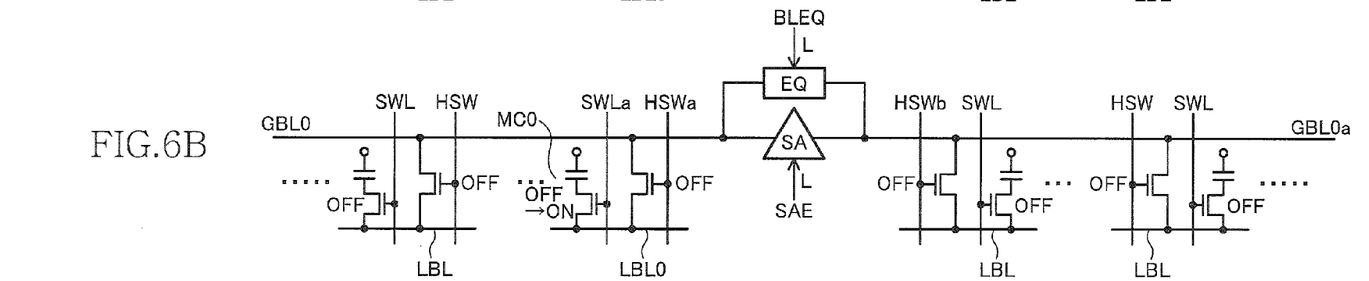

In the example shown in FIG. 5, high-level data is stored in the memory cell capacitor CS of the memory cell MC0 and low-level data is stored in the memory cell capacitor CS of the memory cell MC1. Accordingly, at the time t2, the potential of the local bit line LBL0 increases from a precharge level and the potential of the local bit line LBL1 decreases from the precharge level. An operation performed before and after the time t2 is as shown in FIG. 6B. The switch circuits SW are still in an off state at the time t2. Therefore, only a capacitance of the local bit line LBL0 is added to a capacitance of the memory cell MC0 without adding a capacitance of the global bit line GBL0 so that a potential change in the local bit line LBL0 is relatively large. Although not shown in FIG. 6B, the same holds true for the local bit line LBL1. When the sub-word line SWLa related to one global bit line GBL0 is selected as shown in FIG. 6B, all of the sub-word lines SWL related to the other global bit line GBL0a become unselected. Among the plural sub-word lines SWL related to one global bit line GBL0, two or more sub-word lines SWL are not selected at the same time.

Figure 6C:
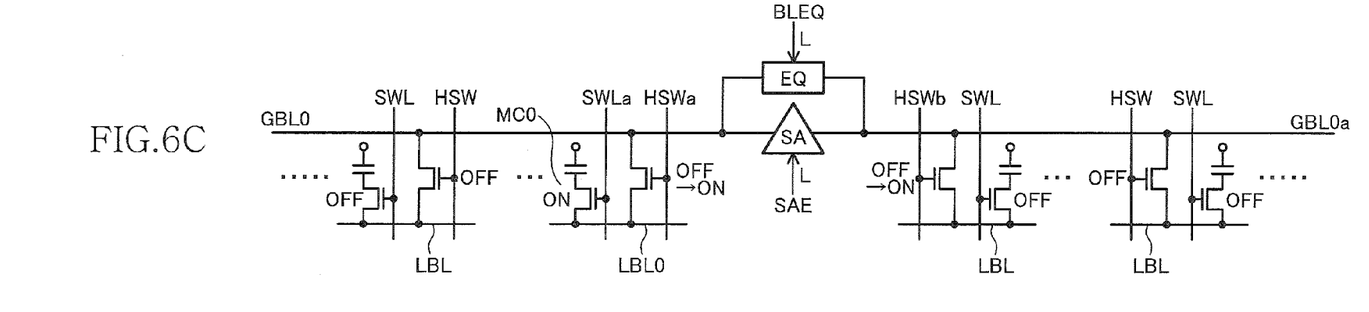

At a time t3, the local-switch control signal S2 is activated. This changes a hierarchy switch line HSW specified by the row address to a high level. In the example shown in FIG. 5, a hierarchy switch line HSWa is selected based on the address signal ADD input at the time t0. As shown in FIG. 2, the switch circuits SW controlled by the hierarchy switch line HSWa are allocated to the local bit lines LBL0 and LBL1. When the hierarchy switch line HSWa is activated, the switch circuits SW allocated to the local bit lines LBL0 and LBL1 are turned on, and accordingly the local bit line LBL0 is connected to the global bit line GBL0 while the local bit line LBL1 is connected to a global bit line GBL1. An operation performed before and after the time t3 is shown in FIG. 6C. As shown in FIG. 6C, when the sub-word line SWLa related to one global bit line GBL0 is selected, the hierarchy switch line HSWa related to the global bit line GBL0 is activated and a hierarchy switch line HSWb related to the other global bit line GBL0a is also activated. Although the other global bit line GBL0a is a bit line on a reference side, the hierarchy switch line HSWb is also activated to maintain capacitance balance between the global bit line GBL0 on a data read side and the global bit line GBL0a on the reference side.

When the switch circuits SW are turned on, potentials of the global bit lines GBL change according to potentials of the local bit lines LBL. However, because capacitances of the global bit lines GEL are larger than capacitances of the local bit lines LEL, potential changes in the global bit lines GEL are not so large. Because the capacitances of the global bit lines GBL are added to the capacitance of the local bit lines LBL when the switch circuits SW are turned on, the potentials of the local bit lines LBL are slightly returned to the precharge level and signal components are reduced.

Figure 7:
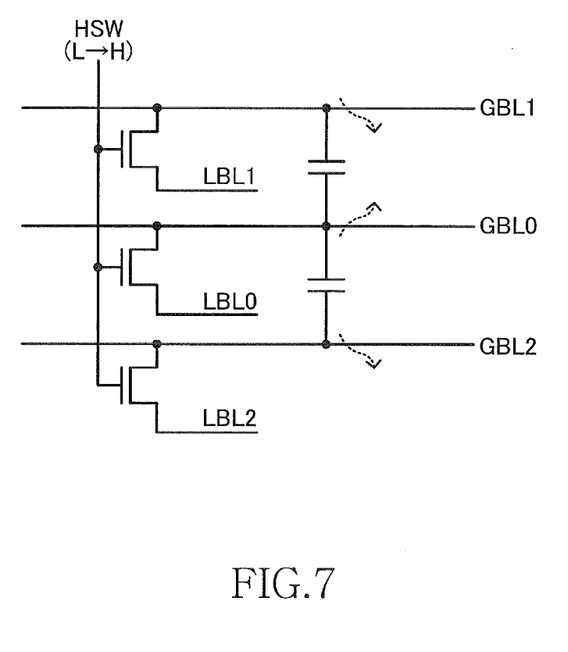
FIG. 7 is a diagram for explaining a case where influence of coupling noise is the largest.

Particularly when data read out to adjacent global bit lines GBL have opposite logic levels, an amount of reduction in the signal components is increased due to the influence of coupling noise. FIG. 7 shows a case where the influence of coupling noise is the greatest. In an example shown in FIG. 7, high-level data is read out to a global bit line GBL0 and low-level data are read out to global bit lines GBL1 and GBL2. As shown FIG. 7, each of the global bit lines GBL1 and GBL2 is contiguous to the global bit line GBL0. In this case, the global bit line GBL0 is subject to low-level noise from both sides thereof and thus an amount of reduction in the signal components is increased.

Also in the example shown in FIG. 5, because the data read out to the global bit line GBL0 is at a high level and the data read out to the global bit line GBL1 contiguous to the global bit line GBL0 is at a low level, the potential on the global bit line GBL0 is reduced due to the influence of coupling noise as indicated by a solid waveform. A dashed waveform indicates a potential change in a case where there was no influence of coupling noise. In this manner, while the signal components read out to the global bit lines GBL0 is reduced by the coupling noise, the data is not inverted even when the switch circuits SW are turned on in the present embodiment because the data is sufficiently read out to the local bit line LBL0 before the switch circuits SW are turned on.

At a time t4, the sense-amplifier enable signal SAE changes to a high level and then the sense amplifiers SA are activated. This amplifies a potential difference generated in each pair of global bit lines GBL. Although not shown in FIG. 5, for example, when a read command is then issued, one of the sense amplifiers SA is selected based on the column address and data is output via the data amplifier 34 and the data input/output circuit 40 shown in FIG. 1. When the operation shown in FIG. 5 is an operation in response to the auto-refresh command or the self-refresh signal SR, data read out from the memory cells MC are restored by the sense amplifiers SA.

As described above, in the semiconductor device 10 according to the present embodiment, because the switch circuits SW are turned on after one sub-word line SWL is activated, the influence of coupling noise can be reduced.

An operation of a semiconductor device that the inventor has conceived as a prototype in the course of making the present invention will be explained with reference to FIG. 8.

Figure 8:
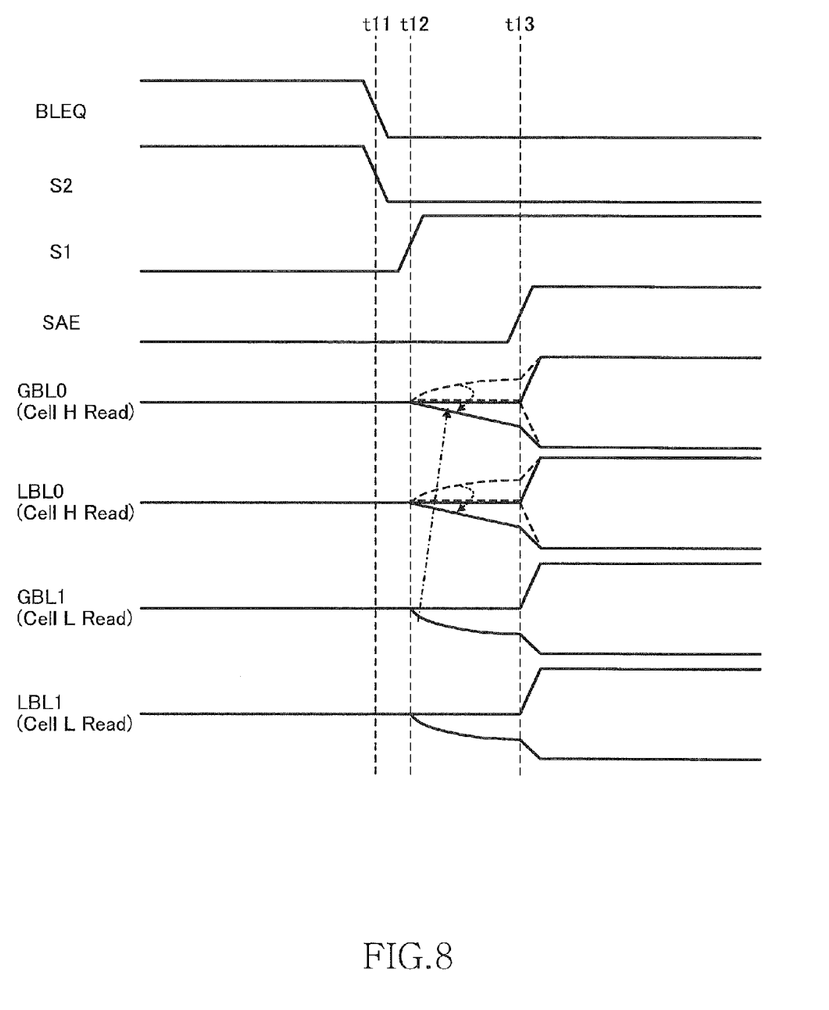
FIG. 8 is a timing chart for explaining an operation of a semiconductor device that the inventor has conceived as a prototype in the course of making the present invention.
Figures 9A, 9B:
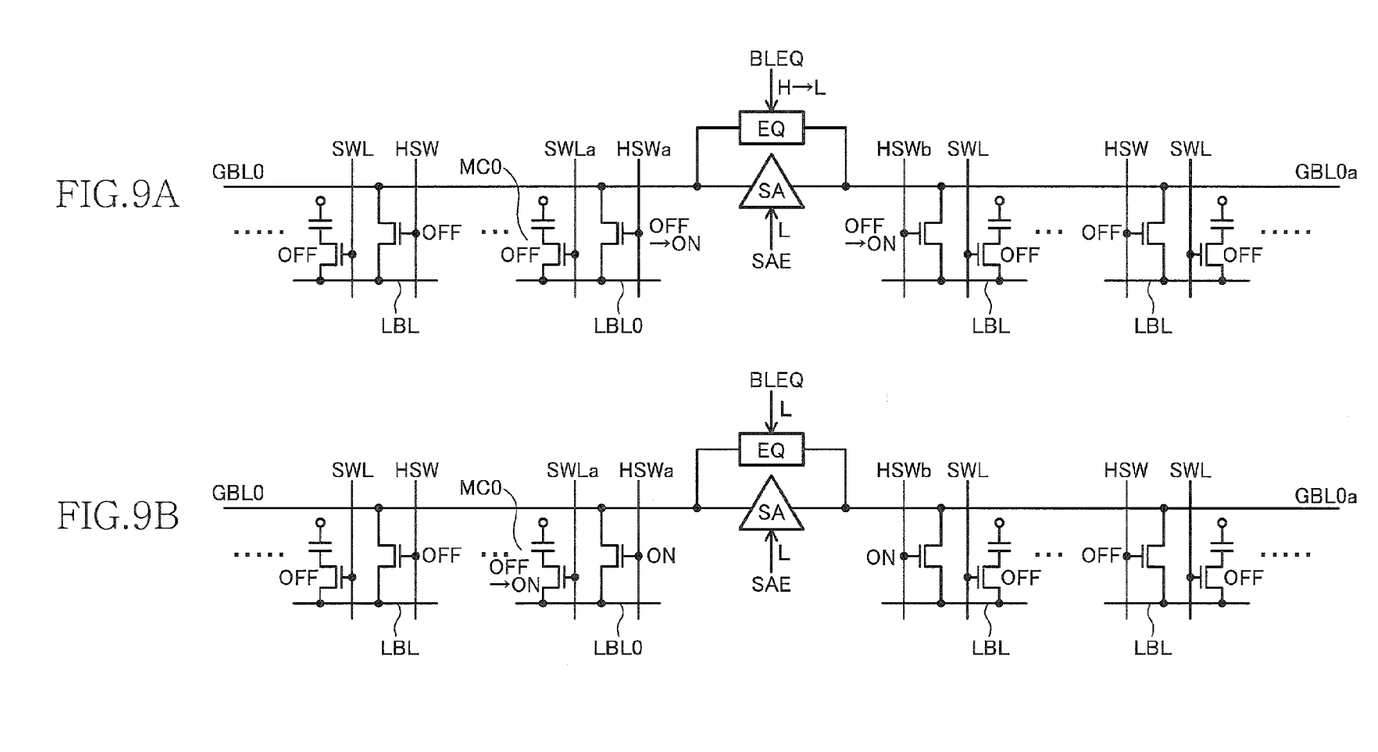
FIGS. 9A and 9B are circuit diagrams for explaining an operation at each operation timing in the prototype semiconductor device.

In the prototype example, the equalization signal BLEQ is deactivated to a low level and the local-switch control signal S2 is activated at a time t11 as shown in FIG. 8. This releases equalization of each pair of global bit lines GBL and changes hierarchy switch lines HSW specified by the row address to a high level. An operation performed before and after the time t11 is as shown in FIG. 9A. FIG. 9A shows a state where the equalization signal BLEQ changes from a high level to a low level and switch circuits SW controlled by the hierarchy switch lines HSWa and HSWb turn from off to on.

At a time t12, the sub-word control signal S1 is activated and the sub-word line SWLa specified by the row address changes to a high level. This causes data of corresponding memory cells MC to be read out to the local bit lines LBL0 and LBL1, respectively. FIG. 8 shows an example in which high-level data is read out from the memory cell MC connected to the local bit line LBL0 and low-level data is read out from the memory cell MC connected to the local bit line LBL1. An operation performed before and after the time t12 is as shown in FIG. 9B and the switch circuits SW are already on at the time t12.

As described above, because the switch circuits SW are already on at the time t12 in this example, a capacitance connected to each of the corresponding memory cells MC is a sum of a capacitance of the corresponding local bit line LBL and a capacitance of the corresponding global bit line GBL. Accordingly, as compared to the embodiment explained above, potential changes in the local bit line LBL and the global bit line GBL are less. Furthermore, when the sub-word control signal S1 is activated at the time t12, coupling noise between adjacent global bit lines GBL immediately occurs. Particularly when a threshold voltage in the transistor included in the sense amplifier SA is low, a sense operation may be performed even when the sense-amplifier enable signal SAE is deactivated. Such a phenomenon is called "pre-sense" and, when the pre-sense occurs, a potential difference caused by noise is adversely amplified.

In the example shown in FIG. 8, the potential on the global bit line GBL0 is reduced due to the influence of coupling noise and is lower than the precharge level as indicated by a solid waveform. A dashed waveform shows a potential change in a case where there is no influence of coupling noise. In this way, when the global bit line GBL is subject to coupling noise in a state where a signal component is small, data may be inverted. As shown in FIG. 8, inverted data is gradually amplified due to the influence of the pre-sense. When the sense-amplifier enable signal SAE is activated at a time t13, the inverted data is fully amplified and thus erroneous data is output in a read operation. When the operation shown in FIG. 8 is an operation in response to the auto-refresh command or the self-refresh signal SR, erroneous data is restored.

On the other hand, in the semiconductor device 10 according to the present embodiment mentioned above, the switch circuits SW are turned on after the sub-word line SWL is activated, which reduces the risk of data inversion due to the influence of coupling noise. Accordingly, a reliable semiconductor device can be provided.

A second embodiment of the present invention is explained next.

Figure 10:
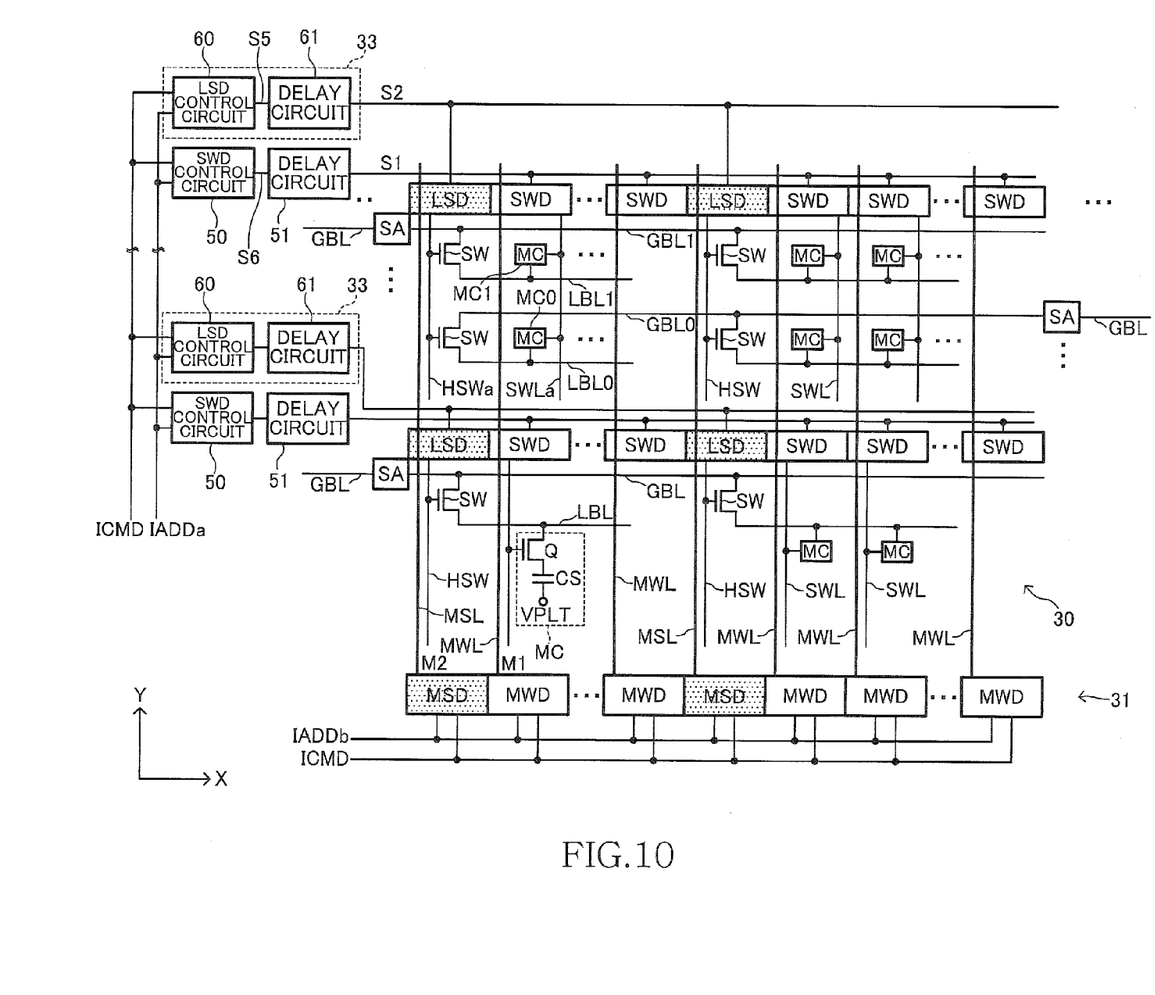
FIG. 10 is a circuit diagram for explaining a semiconductor device according to a second embodiment of the present invention.

Turning to FIG. 10, the semiconductor device according to the second embodiment is different from that according to the first embodiment in that a delay circuit 51 is added at a subsequent stage of the sub-word control circuit 50. In the present invention, the delay circuit 51 is also referred to as "second delay circuit". The configuration other than this is the same as that according to the first embodiment as shown in FIG. 2. Therefore, constituent elements identical to those of the first embodiment are designated by like reference characters and overlapping explanations thereof will be omitted.

The sub-word control signal S1 in the present embodiment is a signal obtained by delaying a sub-word control signal S6 output from the sub-word control circuit 50 with the delay circuit 51. The delay circuit 51 is an element included in the X decoder 31 shown in FIG. 1 and is designed to have delay time smaller than that of the delay circuit 61. Accordingly, while activation timings of the sub-word control signal S6 and the local-switch control signal S5 are substantially the same, an activation timing of the local-switch control signal S2 is delayed by predetermined time from an activation timing of the sub-word control signal S1. The predetermined time is defined by a difference in delay time between the delay circuit 51 and the delay circuit 61.

Also with this configuration, the switch circuits SW can be turned on after the corresponding sub-word line SWL is activated, and therefore effects identical to those of the first embodiment can be obtained.

A third embodiment of the present invention is explained next.

Figure 11:
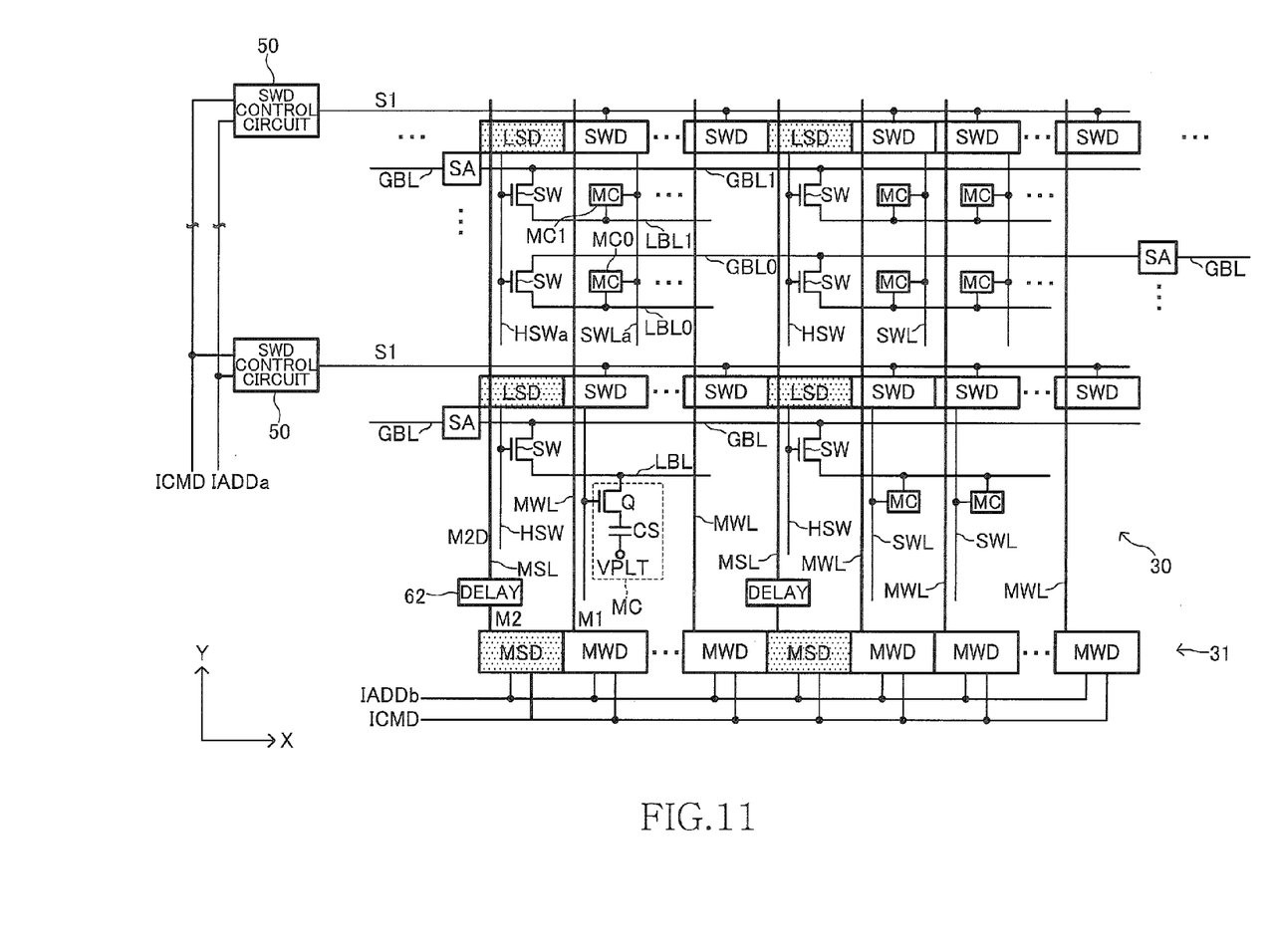
FIG. 11 is a circuit diagram for explaining a semiconductor device according to a third embodiment of the present invention.

Turning to FIG. 11, the semiconductor device according to the third embodiment is different from that according to the first embodiment in that the local-switch control circuit 60 and the delay circuit 61 are omitted and a delay circuit 62 is connected to each of the main switch lines MSL instead. Accordingly, the local switch driver LSD also has a different circuit configuration from that shown in FIG. 4.

Figure 12:
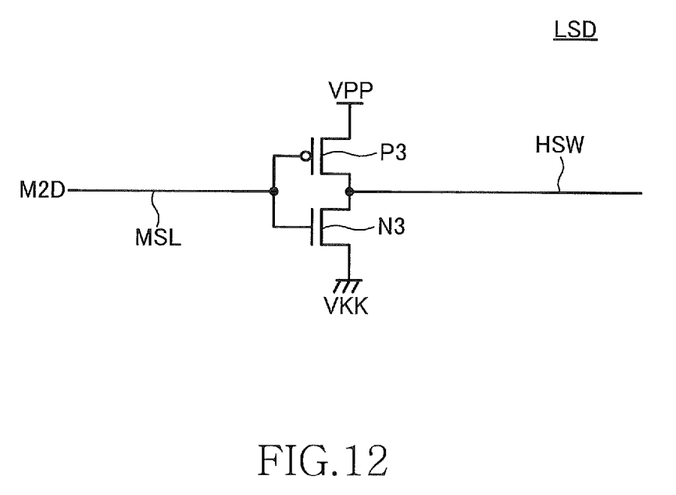
FIG. 12 is a circuit diagram of a local switch driver shown in FIG. 11.

The local switch driver LSD shown in FIG. 12 is different from that shown in FIG. 4 in that the transistor P2 is omitted. Accordingly, when a main-switch control signal M2D is activated to a low level, the hierarchy switch lines HSW are driven at a boost potential VPP. The main-switch control signal M2D is a signal obtained by delaying the main-switch control signal M2 output from the main switch driver MSD with the delay circuit 62.

Accordingly, while activation timings of the main word signal M1 and the main-switch control signal M2 are substantially the same, an activation timing of the main-switch control signal M2D is delayed by a predetermined time from the activation timing of the main word signal M1. Therefore, also in the present embodiment, the switch circuits SW can be turned on after the corresponding sub-word line SWL is activated, and thus effects identical to those of the first, embodiment can be obtained. Furthermore, according to the present embodiment, the circuit configuration can be more simplified.

It is apparent that the present invention is not limited to the above embodiments, but may be modified and changed without departing from the scope and spirit of the invention.

For example, while one sense amplifier SA is connected to each pair of global bit lines GBL and a potential difference generated in each pair of global bit lines GEL is amplified by the corresponding sense amplifier SA in the embodiments mentioned above, this point is not essential in the present invention. Therefore, data can be amplified by comparing a potential of one global bit line GBL with a predetermined reference potential.

While the bit lines are hierarchized into the global bit lines GBL and the local bit lines LBL in the embodiments mentioned above, the bit lines can be hierarchized into three or more levels in the present invention.

Furthermore, while the equalization signal BLEQ is deactivated before the sub-word line SWL is activated when the active command is issued in the embodiments mentioned above, the equalization signal BLEQ can be deactivated at any timing before the switch circuits SW are turned on. Therefore, the equalization signal BLEQ can be deactivated after the sub-word line SWL is activated and before the switch circuits SW, are turned on. However, it is more preferable to deactivate the equalization signal BLEQ before the sub-word line SWL is activated as in the embodiment described above because an operation margin becomes larger.

What is claimed is:
1. A semiconductor device comprising:
first and second global bit lines;
a sense amplifier configured to amplify a potential difference between the first and second global bit lines;
first and second local bit lines;
a first switch circuit connected between the first local bit line and the first global bit line;

a second switch circuit connected between the second local bit line and the second global bit line;

first and second memory cells;

a first cell transistor connected between the first memory cell and the first local bit line;

a second cell transistor connected between the second memory cell and the second local bit line; and a control circuit configured to change states of the first and second switch circuits into ON states after changing a state of one of the first and second cell transistors into an ON state in response to a predetermined command, wherein the changing of one of the first and second cell transistors to an ON state occurs while the first and second switch circuits are in OFF states.

2. The semiconductor device as claimed in claim 1, wherein the control circuit is configured to activate the sense amplifier after changing states of the first and second switch circuits into the ON states in response to the predetermined command.

3. The semiconductor device as claimed in claim 2, further comprising an equalizer circuit that is configured to equalize potentials of the first and second global bit lines, wherein the control circuit is configured to deactivate the equalizer circuit before changing states of the first and second switch circuits into the ON states in response to the predetermined command.

4. The semiconductor device as claimed in claim 3, wherein the control circuit is configured to deactivate the equalizer circuit before changing the state of one of the first and second cell transistors into the ON state in response to the predetermined command.

5. The semiconductor device as claimed in claim 1, wherein each of the first and second memory cells comprises a capacitor.

6. The semiconductor device as claimed in claim 5, wherein the predetermined command is an active command or an auto-refresh command issued from outside.

7. The semiconductor device as claimed in claim 5, wherein the predetermined command is a self-refresh signal that is periodically activated.

8. The semiconductor device as claimed in claim 1, wherein the first switch circuit comprises a first transistor that includes a first control electrode coupled to the control circuit, a first main electrode coupled to the first global bit line without an intervention of any transistors therebetween, and a second main electrode coupled to the first local bit line without an intervention of any transistors therebetween, and the second switch circuit comprises a second transistor that includes a second control electrode coupled to the control circuit, a third main electrode coupled to the second global bit line without an intervention of any transistors therebetween, and a fourth main electrode coupled to the second local bit line without an intervention of any transistors therebetween.

9. The semiconductor device as claimed in claim 1, wherein the first switch circuit comprises a first transistor that includes a first control electrode coupled to the control circuit, a first main electrode coupled directly to the first global bit line, and a second main electrode coupled directly to the first local bit line, and the second switch circuit comprises a second transistor that includes a second control electrode coupled to the control circuit, a third main electrode coupled directly to the second global bit line, and a fourth main electrode coupled directly to the second local bit line.

10. The semiconductor device as claimed in claim 1, wherein the first cell transistor is connected to the first switch circuit through at least a part of the first local bit line.

* * * * *